(12) United States Patent
Ikeda et al.

(10) Patent No.: US 8,766,831 B2
(45) Date of Patent: Jul. 1, 2014

(54) SUCCESSIVE APPROXIMATION A/D CONVERTER

(71) Applicant: Kabushiki Kaisha Toshiba, Tokyo (JP)

(72) Inventors: Shinichi Ikeda, Kanagawa (JP); Hirotomo Ishii, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/784,602

(22) Filed: Mar. 4, 2013

(65) Prior Publication Data
US 2013/0249728 A1 Sep. 26, 2013

(30) Foreign Application Priority Data
Mar. 26, 2012 (JP) .................................. 2012-069868

(51) Int. Cl.
*H03M 1/06* (2006.01)
(52) U.S. Cl.
USPC .......................................... 341/118; 341/155
(58) Field of Classification Search
CPC ........ H03M 1/00; H03M 1/12; H03M 1/0695
USPC .......................... 341/118, 155, 120, 156, 161
See application file for complete search history.

(56) References Cited

U.S. PATENT DOCUMENTS

| 5,852,415 A | 12/1998 | Cotter et al. |
| 6,304,208 B1 | 10/2001 | Nagashima |
| 8,427,355 B2 * | 4/2013 | Sin et al. ...................... 341/161 |
| 2007/0035434 A1 | 2/2007 | Tachibana et al. |

* cited by examiner

*Primary Examiner* — Joseph Lauture
(74) *Attorney, Agent, or Firm* — Patterson & Sheridan, LLP

(57) ABSTRACT

A successive-approximation A/D converter includes a reference voltage generator configured to generate a reference voltage, a comparator configured to receive an input analog signal and generate a voltage difference by comparing the input analog signal and the reference voltage, an error-correction circuit including a variable capacitor configured to correct the voltage difference based on a capacitance of the variable capacitor, an error-correction controller configured to retrieve from memory a correction amount and control the error-correction circuit to vary the capacitance of the variable capacitor according to the correction amount, and a successive approximation register logic circuit configured to generate an output digital signal based on the voltage difference from the comparator.

20 Claims, 4 Drawing Sheets

SUCCESSIVE APPROXIMATION A/D CONVERTER

CROSS-REFERENCE TO RELATED APPLICATION

This application is based upon and claims the benefit of priority from Japanese Patent Application No. 2012-069868, filed Mar. 26, 2012, the entire contents of which are incorporated herein by reference.

FIELD

Embodiments described herein relate to a successive approximation A/D converter.

BACKGROUND

A successive approximation analog-to-digital (A/D) converter is a type of analog-to-digital converter that converts a continuous analog waveform into a discrete digital representation via a binary search through all possible quantization levels before finally converging upon a digital output for each conversion. The integral non-linearity (INL) of a successive-approximation A/D converter is dependent on the INL of a D/A converter circuit (e.g., reference voltage generator) in the successive-approximation A/D converter. Thus, the INL of the successive-approximation A/D converter deteriorates if there is great variability among the elements used within the D/A-converter circuit (e.g., reference voltage generator).

DETAILED DESCRIPTION

In general, embodiments will be described with reference to the drawings.

A successive-approximation A/D converter according to an embodiment converts analog signals to digital signals. The successive-approximation A/D converter includes a reference voltage generator configured to generate a reference voltage, a comparator configured to receive an input analog signal and generate a voltage difference by comparing the input analog signal and the reference voltage, an error-correction circuit including a variable capacitor configured to correct the voltage difference based on a capacitance of the variable capacitor, an error-correction controller configured to retrieve from memory a correction amount and control the error-correction circuit to vary the capacitance of the variable capacitor according to the correction amount, and a successive approximation register logic circuit configured to generate an output digital signal based on the voltage difference from the comparator.

First Embodiment

Figure 1:
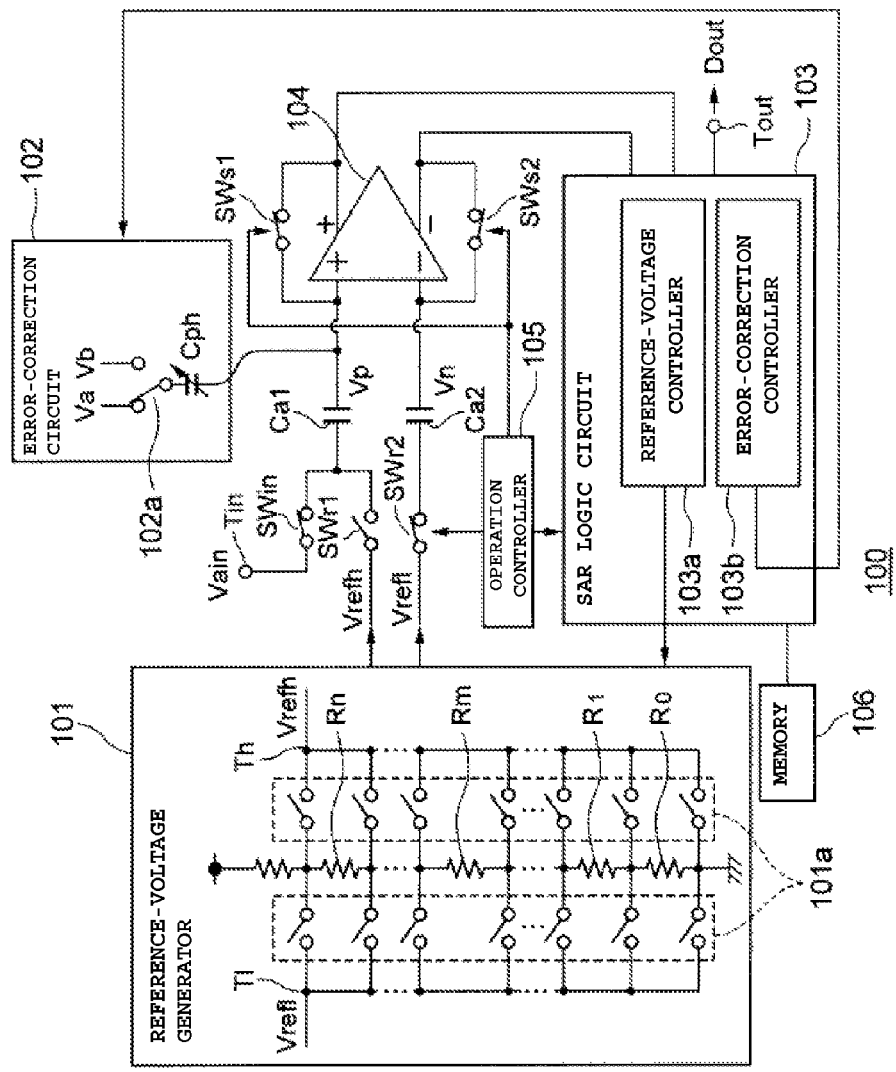
FIG. 1 is a sample configuration of a successive-approximation A/D converter according to a first embodiment.

FIG. 1 illustrates a sample configuration of a successive-approximation A/D converter 100 according to a first embodiment.

As illustrated in FIG. 1, the successive-approximation A/D converter 100 that converts analog signals to digital signals includes without limitation the following: an input switch SWin, a first reference switch SWr1, a second reference switch SWr2, a first switch SWs1, a second switch SWs2, a first capacitor Ca1, the reference voltage generator 101, an error-correction circuit 102, an SAR logic circuit 103, a comparator 104, an operation controller 105, and a memory 106.

One end of the input switch SWin is connected to a signal input terminal Tin that receives the analog signals Vain.

The reference voltage generator 101 includes the following: a reference resistance R0 that has one grounded end; resistances R1 to Rn that are numbered from 1, . . . m, . . . n (n=positive integer, 1≤m≤n), which are connected in series between the other end of the reference resistance R0 and a power source; and a switch circuit SW. Beginning from the reference resistance R0 at the other end, the resistances R1 to Rn that are numbered from 1, . . . n are allocated in order from the first resistance R1 to the nth resistance Rn.

This reference voltage generator 101 is designed to output the first reference voltage Vrefh and the second reference voltage Vrefl that are generated by switching a switch circuit 101a and dividing a source voltage by the reference resistance R0 and the first or nth resistance R1 or Rn.

The first reference voltage Vrefh output from the reference voltage generator 101 is designed to apply to one end of the first reference switch SWr1.

The second reference voltage Vrefl output from the reference voltage generator 101 is designed to apply to one end of the second reference switch SWr2.

One end of the first capacitor Ca1 is connected to the other ends of the input switch SWin and the first reference switch SWr1.

One end of a second capacitor Ca2 is connected to the other end of the second reference switch SWr2.

The comparator 104 is connected to the other end of the first capacitor Ca1 through a non-inverting input terminal (first input terminal) and to the other end of the second capacitor Ca2 through an inverting input terminal (second input terminal). The comparator 104 can be set so that the inverting output terminal is grounded. When the inverting output terminal is grounded, the first reference voltage Vrefh can be connected to the first capacitor Ca1 as a reference-voltage; the benefits of the present embodiment can be achieved without using the second reference voltage Vrefl.

This comparator 104 is designed to output signals from a non-inverting output terminal (first output terminal) and an inverting output terminal (second output terminal) with respect to a comparison result of the signals Vp and Vn, which are input to the non-inverting input terminal and the inverting input terminal, respectively.

The first switch SWs1 is connected between the non-inverting input terminal and the non-inverting output terminal.

The second switch SWs2 is connected between the inverting input terminal and the inverting output terminal.

The error-correction circuit 102 has a switching circuit 102a and a first variable capacitor Cph.

The switching circuit 102a is designed to be controlled by an error-correction controller 103b, to switch between a first correction voltage Va and a second correction voltage Vb, and to apply the correction voltage to the other end of the first variable capacitance Cph.

For the first variable capacitance Cph, one end is connected to the other end of the first capacitor Ca1; to the other end, either the first correction voltage Va or a second correction voltage Vb that is different from the first correction voltage Va is applied through the switching circuit 102a.

The SAR logic circuit 103 is designed to output digital signals to a signal-output terminal Tout with respect to the logic of the signals that the comparator 104 outputs from the non-inverting output terminal and the inverting output terminal.

This SAR logic circuit 103 has a reference voltage controller 103a and an error-correction controller 103b.

The reference voltage controller 103a is designed to change the first and second reference-voltages Vrefh and Vrefl by controlling the reference voltage generator 101 (the switch circuit 101a).

By controlling the error-correction circuit 102 (the switching circuit 102a), the error-correction controller 103b is designed to control the capacitance value of the first variable capacitor Cph and the switching between the first correction voltage Va and the second correction voltage Vb that are applied to the other end of the first variable capacitor Cph. The actual voltage values of the correction voltages Va and Vb are not so important as having consistent voltage values throughout the processes of calibration and having consistent voltage values throughout the processes of normal usage. For example, changing the value of the first correction voltage Va midway through a calibration period, or midway through normal usage, is likely to yield error-correction parameters that are inaccurate and unusable. Calibration and normal usage of the successive approximation A/D converter are further discussed below.

The memory 106 is designed to maintain the correction amount of the first through nth resistances that the SAR logic circuit 103 acquires.

The operation controller 105 is designed to regulate the first and second switches SWs1 and SWs2, the first and second reference switches SWr1 and SWr2, the input switch SWin, and the SAR logic circuit 103.

One example of operating the successive-approximation A/D converter 100 having the previously described configuration is described. The following passages describe a normal operation that converts the analog signals Vain to the digital signals Dout and an operation being executed separately during a calibration period before the normal operation.

Figure 2:
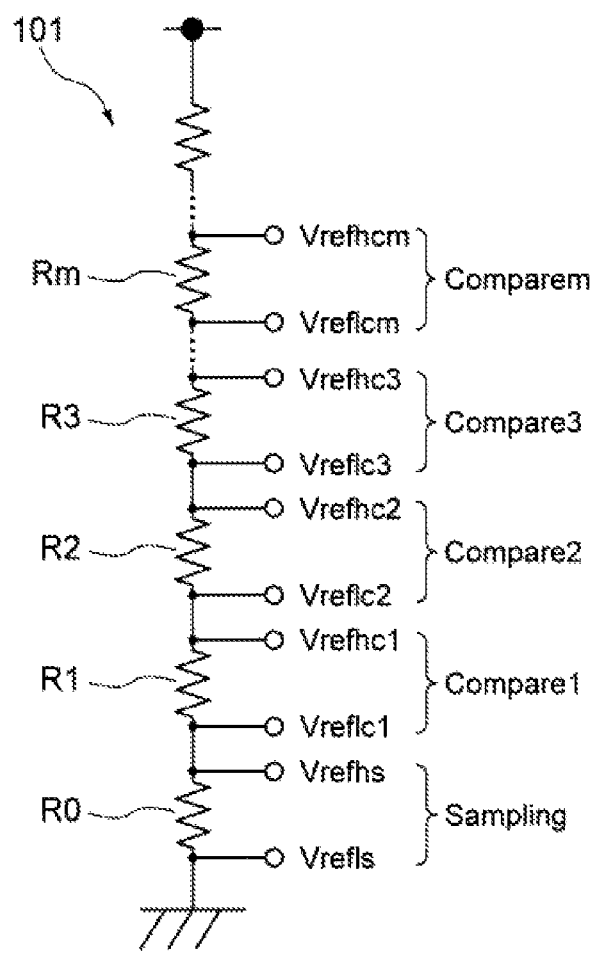
FIG. 2 is an example of the first and second reference voltages that a reference voltage generator, shown in FIG. 1, outputs upon executing an error-correction calculation.

FIG. 2 illustrates one example of the first and second reference-voltages Vrefh and Vrefl that the reference voltage generator 101 in FIG. 1 outputs during the calibration period. The switch circuit 101a is omitted in this FIG. 2.

First, the operation during the calibration period prior to normal operation will be described.

In the calibration period, the operation controller 105 turns off the input switch SWin and turns on the first and second reference switches SWr1 and SWr2.

At this point, a sampling action is executed. More specifically, the reference voltage generator 101 outputs a voltage at other end of the reference resistance R0 (a voltage Vrefhs at other end of the reference resistance R0) as the first reference voltage Vrefh and a voltage at the one end of the reference resistance R0 (a voltage Vrefls at the one end of the reference resistance R0) as the second reference voltage Vrefl, as illustrated in FIG. 2. In addition, the error-correction circuit 102 applies the first correction voltage Va to the other end of the first variable capacitor Cph.

Next, the operation controller 105 turns on the first and second switches SWs1 and SWs2 (e.g., the comparator 104 is deactivated). The first and second switches SWs1 and SWs2 thereby short the inputs of the comparator 104 to the outputs of the comparator 104 (e.g., the comparator 104 is deactivated). Then, the SAR logic circuit 103 samples the first and second reference-voltages Vrefh and Vrefl (voltages Vrefhs and Vrefls) as a reference.

Next, a comparison action is executed. The operation controller 105 turns off the first and the second switches SWs1 and SWs2 (e.g., the comparator 104 is activated). Then, the reference voltage generator 101 outputs a voltage at other end of the mth resistance Rm (a voltage Vrefhcm at other end of the mth resistance Rm) as the first reference voltage Vrefh and a voltage at the one end of the mth resistance Rm (a voltage Vreflcm at the one end of the mth resistance Rm) as the second reference voltage Vrefl. In addition, the error-correction circuit 102 applies the second correction voltage Vb to the other end of the first variable capacitor Cph.

Next, the comparator 104 compares the signals that are input to the non-inverting input terminal and the inverting input terminal and then outputs comparison-compensation signals from the non-inverting output terminal and the inverting output terminal with respect to the comparison results.

Thus, the SAR logic circuit 103 acquires the logic of the comparison-compensation signals.

During this calibration period, the sampling described above and the acquisition of the logic of the comparison-compensation signals by the SAR logic circuit 103 are repeated multiple times per each mth resistance Rm. In this case, the SAR logic circuit 103 increases or decreases the capacitance value of the first variable capacitor Cph in a step-wise manner at each sampling by the error-correction circuit 102; upon inversion of the logic of the comparison-compensation signals, the SAR logic circuit maintains the capacitance value of the first variable capacitor Cph as the correction amount of the mth resistance Rm.

The correction amount described above can be expressed as Cp/C×(Va−Vb) in the right side of following formula (1). Cp denotes the capacitance value of the first variable capacitor Cph in the formula (1).

Formula (1)

$$Vp-Vn=(Vrefhs-Vrefls)-(Vrefhcm-Vreflcm)-(Cp/C\times(Va-Vb)) \quad (1)$$

During this calibration period, the SAR logic circuit 103 acquires the correction amount of the first through nth resistances R1 to Rn and maintains the correction amounts in the memory 106.

Next, a normal operation will be described as one example.

In the normal operation, through a reference voltage controller 103a the SAR logic circuit 103 outputs a voltage at the other end of mth resistance Rm from the reference voltage generator 101 as the first reference voltage Vrefh as well as a set second reference voltage Vrefl. In addition, through the error-correction controller 103b, the SAR logic circuit 103 sets the capacitance value of the first variable capacitor Cph in the error-correction circuit 102 to an integrated value of the capacitance value with respect to each correction amount of the first through mth resistances.

Next, the operation controller 105 turns on the input switch SWin and the second reference switch SWr2 and turns off the first reference switch SWr1.

At this point, a sampling action is executed. More specifically, the reference voltage generator 101 outputs the second reference voltage Vrefl. In addition, the error-correction circuit 102 applies the first correction voltage Va to the other end of the first variable capacitor Cph.

Next, the operation controller 105 turns on the first and the second switches SWs1 and SWs2 (e.g., the comparator 104 is deactivated), and the analog signals Vain are sampled.

Next, the operation controller 105 turns off the first and the second switches SWs1 and SWs2 (e.g., the comparator 104 is activated). The reference voltage generator 101 then outputs a voltage at the other end of the mth resistance Rm as the first reference voltage Vrefh as well as the second reference voltage Vrefl. In addition, the error-correction circuit 102 applies the second correction voltage Vb to the other end of the first variable capacitor Cph.

Accordingly, the first reference voltage Vm that the reference voltage generator 101 outputs is corrected according to the following formula (2). Cm denotes the correction amount with respect to each resistance of the reference voltage generator 101 in the formula (2).

Formula (2)

$$Vm'=Vm-((Va-Vb)/C \times \Sigma Cm) \quad (2)$$

Next, the comparator 104 compares the signals Vp and Vn that are input to the non-inverting input terminal and the inverting input terminal, respectively, and then outputs signals from the non-inverting output terminal and the inverting output terminal with respect to the comparison result.

The SAR logic circuit 103 outputs the digital signals Dout to the signal-output terminal Tout with respect to the logic of the signals that the comparator 104 outputs from the non-inverting output terminal and the inverting output terminal.

Thus, during normal operation the error-correction circuit 102 operates with respect to the correction amount. Accordingly, the INL of the reference voltage generator 101 and the error-correction circuit 102 can cancel each other out.

Figure 3:
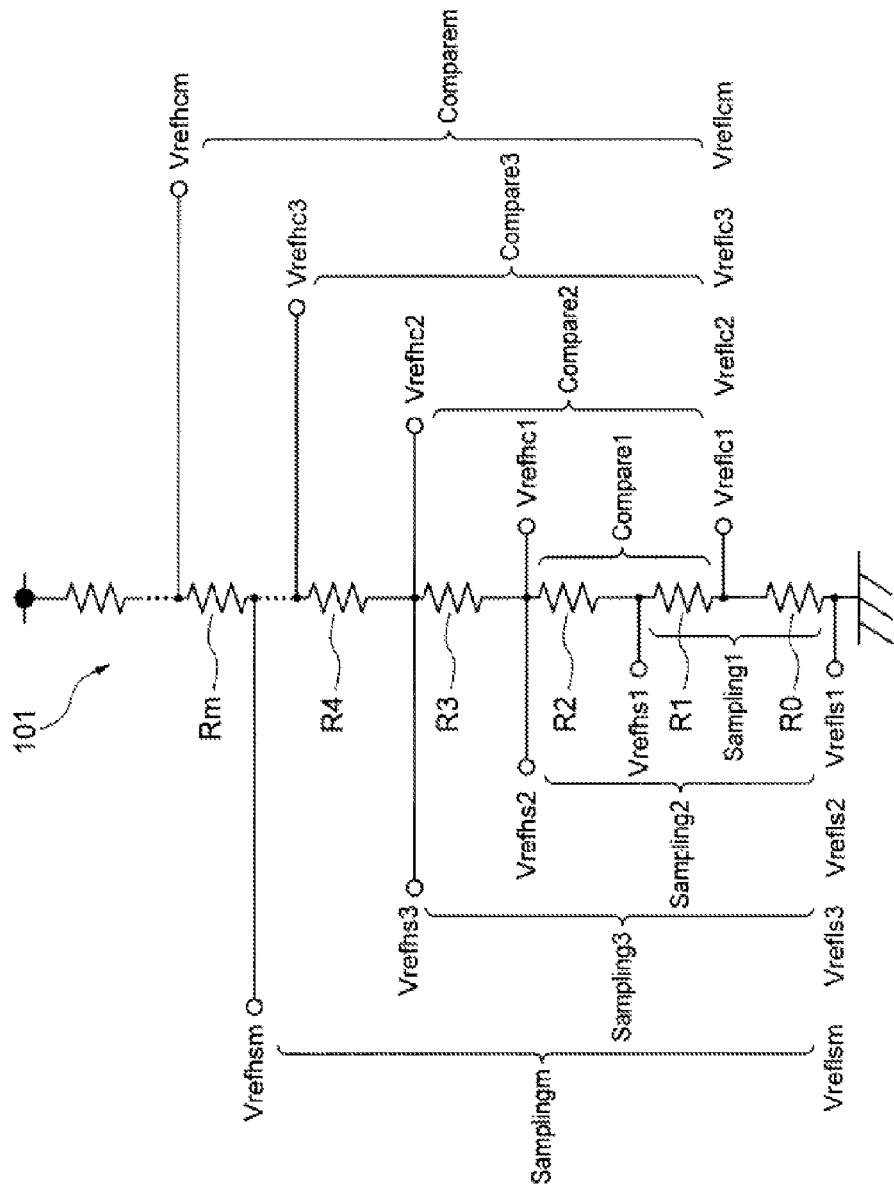
FIG. 3 is another example of the first and second reference voltages that the reference voltage generator, shown in FIG. 1, outputs upon executing an error-correction calculation.

At this point, FIG. 3 illustrates another example of the first and second reference-voltages Vrefh and Vrefl that are output by the reference voltage generator 101 illustrated in FIG. 1. The switch circuit 101a is omitted in FIG. 3.

Herein, one example of acquiring the correction amount of the mth resistance Rm will be described.

Regarding the sampling during the calibration (Sampling), the reference voltage generator 101 outputs a voltage at one end of the reference resistance R0 (a voltage at one end of mth resistance Rm, Vreflsm) as the first reference voltage Vrefh and a voltage at the other end of the reference resistance R0 (a voltage at one end of the reference resistance R0, Vreflsm) as the second reference voltage Vrefl.

Also, regarding the comparison action (Comparem), the reference voltage generator 101 outputs a voltage at other end of the mth resistance Rm (a voltage at the other end of mth resistance Rm, Vreflcm) as the first reference voltage Vrefh and a voltage at the one end of the mth resistance Rm (a voltage at the other end of reference resistance R0, Vreflcm) as the second reference voltage Vrefl.

Other operations are the same as FIG. 2.

Accordingly, a voltage output of the reference voltage generator 101 can minimize the variation of the operating point of the comparator 104.

As described above, the successive-approximation A/D converter relates to the present first embodiment and can correct INL.

Second Embodiment

Another configuration example of the successive-approximation A/D converter will be described in a second embodiment.

Figure 4:
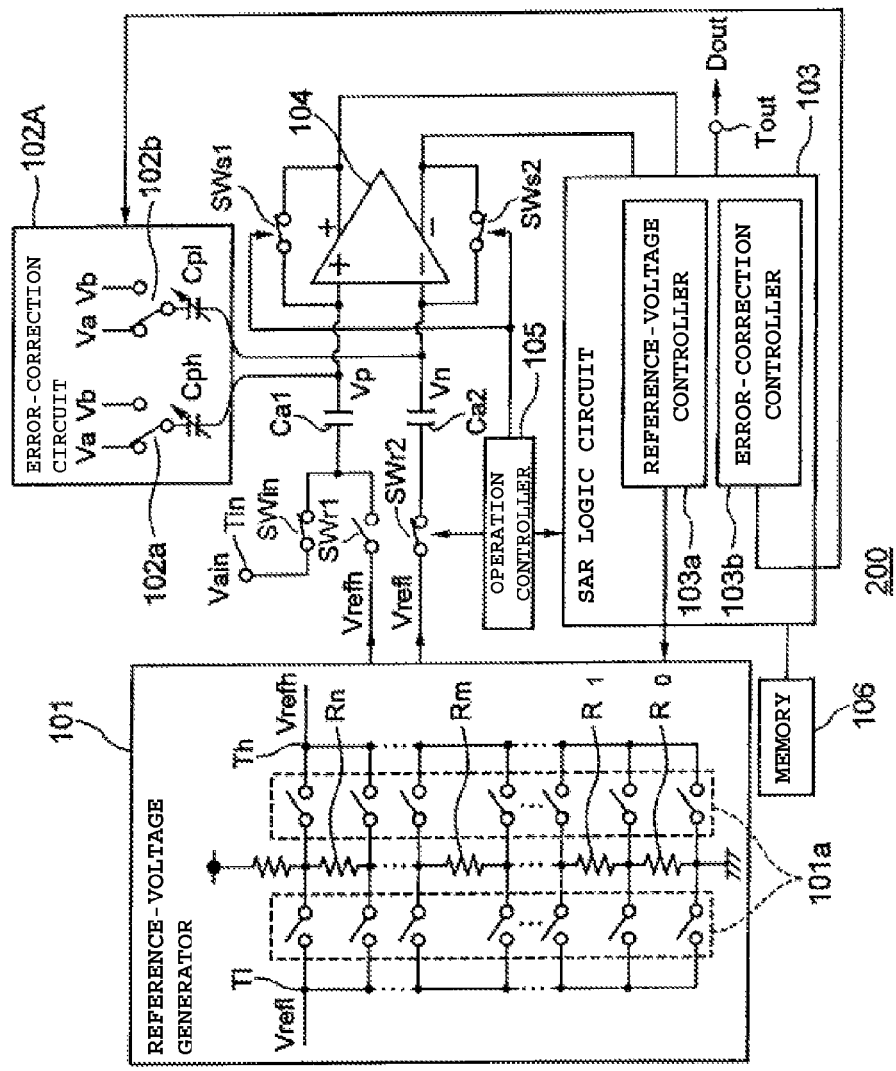
FIG. 4 is a sample configuration of a successive-approximation A/D converter according to a second embodiment.

FIG. 4 illustrates one configuration example of the successive-approximation A/D converter 200 in the second embodiment. In FIG. 4, because the notation is the same as in FIG. 1 and indicates the same configuration as the first embodiment, further explanation is omitted.

In the second embodiment, as illustrated in FIG. 4, the successive-approximation A/D converter 200 includes an input switch SWin, a first reference switch SWr1, a second reference switch SWr2, the first switch SWs1, the second switch SWs2, the first capacitor Ca1, the reference voltage generator 101, an error-correction circuit 102A, the SAR logic circuit 103, the comparator 104, the operation controller 105 and the memory 106.

Compared to the error-correction circuit 102 in the first embodiment, the correction circuit 102A has a second variable capacitor Cpl, one end of which is connected to the other end of a second capacitor Ca2 and to the other end of which any one of a first correction voltage Va or a second correction voltage Vb is applied.

In addition, an error-correction controller 103b is designed to control the error-correction circuit 102A and the switching of the first correction voltage Va and the second correction voltage Vb that are applied to the other end of the second variable capacitor Cpl.

Another configuration of the successive-approximation A/D converter 200 is the same as the first embodiment.

Herein, one example of operating the successive-approximation A/D converter 200 having the previously described configuration will be described.

During a calibration period, as in the first embodiment, samplings and acquisitions of the logic of the comparison-compensation signals by the SAR logic circuit 103 are repeated multiple times per one mth resistance Rm. In this case, the SAR logic circuit 103 increases or decreases the capacitance value of the first variable capacitor Cph in a step-wise manner at every sampling by the error-correction circuit 102A, or the SAR logic circuit increases or decreases the capacitance value of the second variable capacitor Cpl in a step-wise manner at every sampling by the error-correction circuit 102A. The SAR logic circuit 103 then maintains the capacitance value of the first and second variable capacitors Cph and Cpl as a correction amount of the m-th resistance Rm using the logic of the comparison-compensation signals being inverted.

This correction amount is expressed as $(Cph-Cpl)/C \times (Va-Vb)$ in the right side of the following formula (3). In the formula (3), Cph denotes the capacitance value of the first variable capacitor Cph, and Cpl denotes the capacitance value of the second variable capacitor Cpl.

Formula (3)

$$Vp-Vn=(Vrefhs-Vrefls)-(Vrefhc-Vreflc)-((Cph-Cpl)/C \times (Va-Vb)) \quad (3)$$

During this calibration period, the SAR logic circuit 103 acquires the correction amount of the first through nth resistances R1-Rn and maintains the correction amounts in the memory 106.

Next, normal operation will be described as one example.

In the normal operation of the reference voltage controller 103a, the SAR logic circuit 103 outputs a voltage at the other end of the mth resistance Rm from the reference voltage generator 101 as the first reference voltage Vrefh and a set second reference voltage Vrefl. In addition, using the error-correction controller 103b, the SAR logic circuit 103 sets the capacitance value of the first and second variable capacitors Cph and Cpl in the error-correction circuit 102A to an integrated value of the capacitance value with respect to each correction amount of the first through mth resistances.

Next, the operation controller 105 turns on the input switch SWin and the second reference switch SWr2 and turns off the first reference switch SWr1.

At this point, a sampling action is executed. More specifically, the reference voltage generator 101 outputs the second reference voltage Vrefl. In addition, the error-correction circuit 102A applies the first correction voltage Va to the other ends of the first and second variable capacitors Cph and Cpl.

Next, the operation controller 105 turns on the first and second switches SWs1 and SWs2 (e.g., the comparator 104 is deactivated). Accordingly, the analog signals Vain are sampled.

Next, the operation controller 105 turns off the first and the second switches SWs1 and SWs2 (e.g., the comparator 104 is activated). The reference voltage generator 101 then outputs a voltage at the other end of the mth resistance Rm as the first reference voltage Vrefh and the second reference voltage Vrefl; in addition, the error-correction circuit 102A applies the second correction voltage Vb to the other ends of the first and second variable capacitors Cph and Cpl.

Accordingly, the first and second reference-voltages that the reference voltage generator 101 outputs are corrected.

Next, the comparator 104 compares the signals Vp and Vn that are input to the non-inverting input terminal and the inverting input terminal and outputs signals, respectively, from the non-inverting output terminal and the inverting output terminal with respect to the comparison result.

The SAR logic circuit 103 outputs the digital signals Dout to the signal-output terminal Tout with respect to the logic of the signals that the comparator 104 outputs from the non-inverting output terminal and the inverting output terminal.

As described above, the successive-approximation A/D converter relates to the present second embodiment and can correct INL similarly to the first embodiment.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A successive approximation analog-to-digital (A/D) converter, comprising:
   a reference voltage generator configured to generate a reference voltage;
   a comparator configured to receive an input analog signal and generate a voltage difference by comparing the input analog signal and the reference voltage;
   an error-correction circuit including a variable capacitor configured to correct the voltage difference based on a capacitance of the variable capacitor; and
   an error-correction controller configured to retrieve from memory a correction amount and control the error-correction circuit to vary the capacitance of the variable capacitor according to the correction amount.

2. The successive approximation A/D converter of claim 1, wherein the error-correction circuit further includes a second variable capacitor configured to correct the voltage difference based on a capacitance of the second variable capacitor.

3. The successive approximation A/D converter of claim 2, wherein the error-correction controller is configured to retrieve from memory a second correction amount and control the error-correction circuit to vary the capacitance of the second variable capacitor according to the second correction amount.

4. The successive approximation A/D converter of claim 1, wherein the reference voltage generator includes a plurality of resistors connected in series and the reference voltage is generated by dividing a source voltage for the reference voltage generator with one or more of the resistors connected in series.

5. The successive approximation A/D converter of claim 4, wherein the memory stores correction amounts for a number of different voltage levels of the reference voltages.

6. The successive approximation A/D converter of claim 5, further comprising:
   a reference voltage controller configured to control voltage levels of the reference voltage and retrieve corresponding correction amounts from the memory.

7. The successive approximation A/D converter of claim 6, wherein the reference voltage generator includes a plurality of switches and the reference voltage controller is configured to control selection of the switches to generate desired voltage levels of the reference voltages.

8. A method of generating a digital signal from an analog signal, comprising:
   sampling a first reference voltage between both ends of a reference resistor, at least one end of the reference resistor being configured to be connected to a variable capacitor to which a first voltage is applied;
   comparing a second reference voltage between both ends of a resistor for calibration and the first reference voltage, at least one end of the resistor for calibration being configured to be connected to the variable capacitor to which a second voltage is applied;
   storing a correction amount for the resistor for calibration, the correction amount being acquired by repeating the sampling of the first reference voltage and the comparing of the second reference voltage and the first reference voltage while letting a capacitance value of the variable capacitor increase or decrease progressively.

9. The method of claim 8, further comprising:
   correcting a voltage difference between the second reference voltage and the analog signal based on a capacitance value of a variable capacitor which is varied according to the correction amount.

10. The method of claim 9, wherein the second reference voltage is corrected by varying a capacitance of a second variable capacitor.

11. The method of claim 10, further comprising:
    retrieving from the memory a second correction amount, wherein the capacitance of the second variable capacitor is varied according to the second correction amount.

12. The method of claim 8, wherein the first and second reference voltages are generated by dividing a source voltage with one or more resistors connected in series.

13. The method of claim 12, wherein the memory stores correction amounts for a number of different voltage levels of the second reference voltages.

14. The method of claim 13, further comprising:
    selecting the second reference voltage to have a first voltage level and a second voltage level; and
    retrieving correction amounts corresponding to the first and second voltage levels from the memory.

15. The method of claim 14, wherein said selecting includes selectively operating switches that connect each node between the resistors to output the second reference voltage of the first and second levels.

16. A method for determining calibration parameters for a successive approximation analog-to-digital converter having a reference voltage generator that includes a series of resistors, the method comprising:
    sampling a reference voltage difference generated across a reference resistor in the reference voltage generator;

comparing the reference voltage difference to a voltage difference across an mth resistor in the series of resistors;

varying a capacitance of a variable capacitor progressively, a correction amount being configured to cause the voltage difference across the mth resistor to match the reference voltage difference; and storing the correction amount as a correction amount for the mth resistor.

17. The method of claim 16, further comprising:

varying a capacitance of a second variable capacitor progressively, a second correction amount is configured to cause the voltage difference across the mth resistor to match the reference voltage difference; and storing the second correction amount as the correction amount for the mth resistor.

18. The method of claim 16, wherein the capacitance of the variable capacitor is varied separately for each of the resistors in the series.

19. The method of claim 16, wherein the voltage difference between different resistors is selected using switches that connect each node between the resistors to input terminals of a comparator.

20. The method of claim 19, wherein one of the inputs terminals of the comparator is connected to the variable capacitor.

* * * * *